United States Patent
Arai

(10) Patent No.: US 8,018,023 B2
(45) Date of Patent: Sep. 13, 2011

(54) TRENCH SIDEWALL PROTECTION BY A CARBON-RICH LAYER IN A SEMICONDUCTOR DEVICE

(75) Inventor: Shinya Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 12/013,683

(22) Filed: Jan. 14, 2008

(65) Prior Publication Data

US 2009/0179300 A1 Jul. 16, 2009

(51) Int. Cl.
*H01L 29/00* (2006.01)
*H01L 23/48* (2006.01)
*H01L 23/52* (2006.01)
*H01L 29/40* (2006.01)

(52) U.S. Cl. ............ 257/508; 257/751; 257/E21.546; 257/E23.002

(58) Field of Classification Search .......... 257/751, 257/508, E21.546, E23.002
See application file for complete search history.

(56) References Cited

U.S. PATENT DOCUMENTS

| 2007/0232062 | A1* | 10/2007 | Nogami ............ 438/638 |
| 2009/0072401 | A1* | 3/2009 | Arnold et al. ........ 257/751 |
| 2009/0160061 | A1* | 6/2009 | Hsu et al. ........... 257/763 |

FOREIGN PATENT DOCUMENTS

| JP | 2002-367972 | 12/2002 |
| JP | 2003-092287 | 3/2003 |
| JP | 2003-282709 | 10/2003 |
| JP | 2004-207358 | 7/2004 |
| JP | 2004235256 | 8/2004 |
| JP | 2005-197606 | 7/2005 |
| JP | 2005217371 | 8/2005 |
| WO | 03-083935 | 10/2003 |

OTHER PUBLICATIONS

Ahn, et al., "Integration of a low-k alpha-SiOC=H Dielectric with Cu Interconnects", J. Korean Phys. Soc. (South Korea), vol. 41, No. 4: pp. 422-426, Oct. 2002.
Gross, T.S., et al., "Nanoscale Observation of Dielectric Damage to Low k MSQ Interconnects Materials, Technology and reliability of Advanced Interconnects-2005", Symposium Materials Research Society Proceedings, vol. 863), xiii +411, pp. 165-169, 2005.
Bhanap, A., et al., "Repairing Process-Induced Damage to Porous Low-k ILDs by Post Ash Treatment Advanced Metallization", Conference 2003, xxiii+792, pp. 519-523, 2004.
Notice of Reasons for Rejection for corresponding Japanese Application 2008-330642 mailed Nov. 24, 2010.

* cited by examiner

*Primary Examiner* — David S Blum
(74) *Attorney, Agent, or Firm* — Banner & Witcoff, Ltd.

(57) ABSTRACT

When forming a trench in a porous low-K dielectric (such as an ILD) of a semiconductor device, a carbon-rich layer is formed in the sidewalls of the trench during trench etching. This carbon-rich layer may protect the trench from being excessively etched, which would otherwise form an undesirable hardmask undercut. The carbon-rich layer may be formed simultaneously with and during the etching process, by increasing the amount of carbon available to be absorbed by the ILD during the trench etching process. The existence of the extra available carbon may slow the etching of the carbon-enriched regions of the dielectric.

12 Claims, 3 Drawing Sheets

TRENCH SIDEWALL PROTECTION BY A CARBON-RICH LAYER IN A SEMICONDUCTOR DEVICE

BACKGROUND

During the manufacturing of many semiconductor devices, trenches are formed in a layer of material, and then the trenches are filled. For instance, trenches may be formed in the inter-layer dielectric (ILD), and those trenches may be filled with copper, thereby forming interconnect lines along the trenches.

During manufacturing, a continuous hardmask layer is added on top of the ILD, and a patterned resist layer is formed over selected portions of the hardmask. Trenches are then etched through openings in the resist layer. The etching step causes both the exposed hardmask and exposed ILD to be etched, thereby forming a trench in the ILD. However, the ILD is typically more susceptible to etching than the hardmask. This is because ILD often made of a very low-K (e.g., K being 2.5 or less) porous material. Because of this, the trench is formed to be wider at its mouth than the corresponding opening in the hardmask, thereby forming an undercut under the hardmask. Such undercuts can reduce interconnect reliability in the finished product due to increased electro-migration and stress migration problems. This undercut problem has hindered manufacturers from forming interconnects in very low-K ILDs.

Some manufacturers have attempted to avoid this problem by not using a hardmask over the ILD. However, there are problems with not using a hardmask, such as moisture absorption that affects the capacitances between various circuit elements in an unpredictable and undesirable manner.

SUMMARY

Accordingly, there is a need for a way to reduce, or even prevent, undercut of trenches in an inter-layer dielectric (ILD), while still using a hardmask over the ILD. It would be desirable to be able to reduce or prevent such hardmask undercut even where the ILD is a very low-K material that is very readily etched.

To reduce or even prevent hardmask undercut, a carbon-rich layer is formed in the sidewalls of a trench in the ILD. This carbon-rich layer may protect the trench from being excessively etched. The carbon-rich layer may be formed simultaneously with and during the etching process, by increasing the amount of carbon available to be absorbed by the ILD during the trench etching process. The existence of the extra available carbon may slow the etching of the carbon-enriched regions of the ILD.

These and other aspects of the disclosure will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF ILLUSTRATIVE EMBODIMENTS

Figure 1:
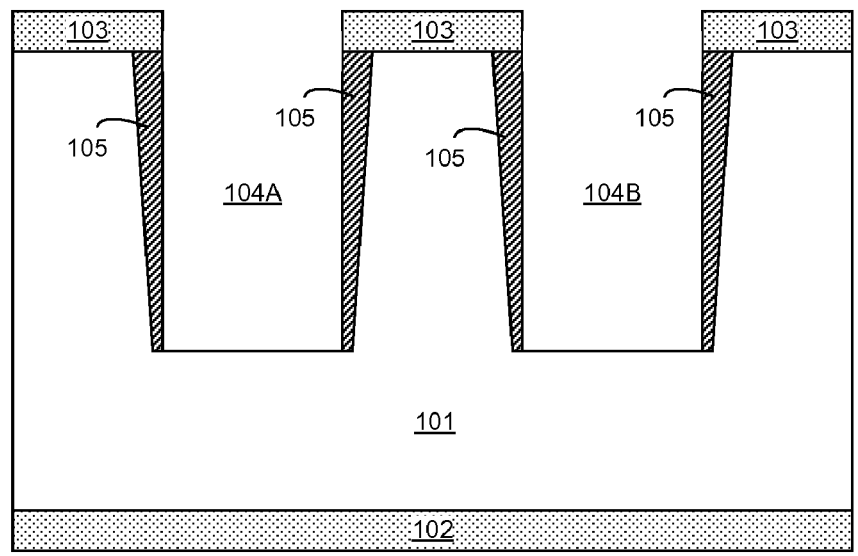
FIGS. 1 and 2 are each a cross-sectional side view of an illustrative semiconductor device without carbon-enriched trench sidewalls, during various steps of manufacturing.

Referring to FIG. 1, a cross-sectional side view of at least a portion of a semiconductor device is shown. The device includes a substrate (not shown), such as silicon or silicon-on-oxide (SOI), over which a lower hardmask layer 102 may be disposed. Lower hardmask layer 102 may be, for example, a nitride such as silicon carbon nitride (SiCN), or an oxide such as silicon dioxide (SiO2). One or more circuit elements (not shown) may be disposed in and/or on the substrate and below lower hardmask layer 102. At least one inter-layer dielectric (ILD) layer 101 is disposed over insulating layer 102. An ILD is typically used to help electrically insulate circuit elements from each other and/or is the location where horizontal interconnects are run to electrically interconnect circuit elements. ILD 101 may be made of any appropriate insulating material, such as hydrogenated silicon oxycarbide (SiCOH) or a material called SiLK semiconductor dielectric resin (a known material available from The Dow Chemical Company).

An upper hardmask layer 103 is disposed on ILD layer 101. Upper hardmask layer 103 may be the same as or a different material from lower hardmask layer 102. Upper hardmask layer 103 may be used to help prevent moisture from being absorbed by ILD 101 during the manufacturing process. Upper hardmask layer 103 may also reduce or even prevent damage to ILD 101 during the subsequent lithography re-work process, which uses oxygen gas.

In FIG. 1, ILD 101 contains two trenches 104A, 104B, each extending lengthwise in a direction normal to the page on which FIG. 1 is shown and is used as a conductive interconnect line. Trenches 104A, 104B are separated from each other by a region of ILD 101.

Trenches 104A, 104B are formed by etching, such as resistive ion etching (RIE), followed by a cleaning process, such as a wet cleaning process. In forming trenches 104A, 104B, both upper hardmask 103 and ILD layer 101 are etched. However, since ILD layer 101 is more readily etched than hardmask layer 103, portions 105 of ILD layer 101 are weakened during etching. In particular, weakened portions 105 are damaged by destroying or changing the bonding between the molecules and the carbon atoms that were (at least previously) part of the molecules. When subsequent stripping of lithographic resist (not shown) is performed, these weakened portions 105 are partially or fully removed. This results in the opening etched in ILD layer 101 that forms each trench 104A, 104B being larger than the corresponding opening etched in upper hardmask layer 103. Accordingly, referring to FIG. 2, an undercut 201 under upper hardmask layer 103 is formed during the resist stripping step. This is undesirable as it can reduce interconnect reliability in the finished product due to increased electro-migration and stress migration problems.

Figure 3:
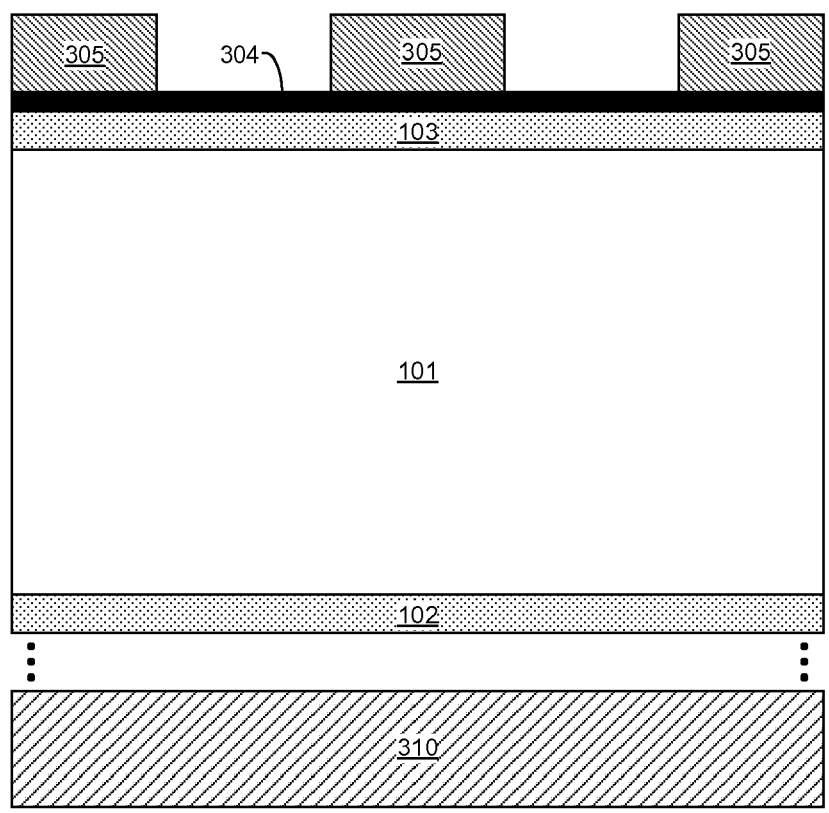
FIGS. 3-5 are each a cross-sectional side view of an illustrative semiconductor device with carbon-enriched trench sidewalls, during various steps of manufacturing.

Thus, an illustrative manufacturing method is now described that can reduce or even prevent such an undercut. Referring to FIG. 3, a silicon layer 310 is provided, which may be a substrate of the semiconductor device or disposed on another substrate, such as part of a silicon-on-oxide (SOI) structure. Circuit elements such as transistors and capacitors (not shown) may be formed on and/or in silicon layer 310.

Lower hardmask layer 102 may be formed on (either directly on or indirectly on with layers in between) silicon layer 310. For instance, another ILD layer (not shown) may be formed on the various circuit elements, and hardmask layer 102 may be formed on that other ILD layer. The terms "formed on" and "disposed on" are to be interpreted to include both directly formed/disposed on (i.e., immediately adjacent with no layers in between; physically touching) and indirectly formed/disposed on (with one or more layers in between).

Next, an anti-reflective coating (ARC) 304 is formed on upper hardmask 103 in preparation for lithography. Then, a photosensitive etch resist layer 305 is formed on ARC 304. The, resist layer 305 is patterned and partially removed through traditional lithographic processes to provide opening where trenches and/or other features are to be formed in underlying ILD 101.

Figure 4:
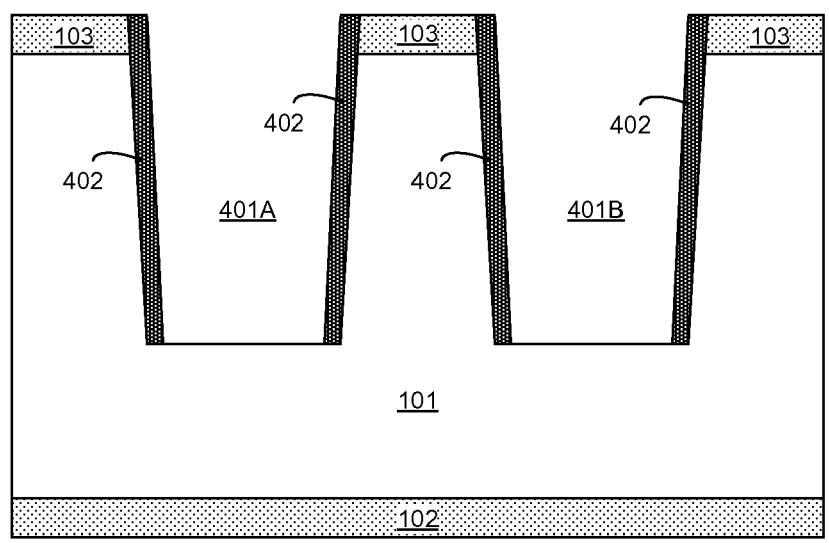

Once the layers as shown in FIG. 3 are formed or otherwise provided, trenches in ILD layer 101 are etched. Referring to FIG. 4, trenches 401A, 401B may be etched using, for example, RIE and subsequent wet cleaning. In this example, each trench 401A, 401B extends lengthwise in a direction normal to the page on which FIG. 4 is shown and is used as a conductive interconnect line. Although two parallel trenches are shown, a single trench may be used or more than two trenches may be used, and multiple trenches may or may not be parallel. Also, trenches 401A, 401B may be electrically isolated from each other or they may electrically connected to each other at one or more points.

Figure 2:
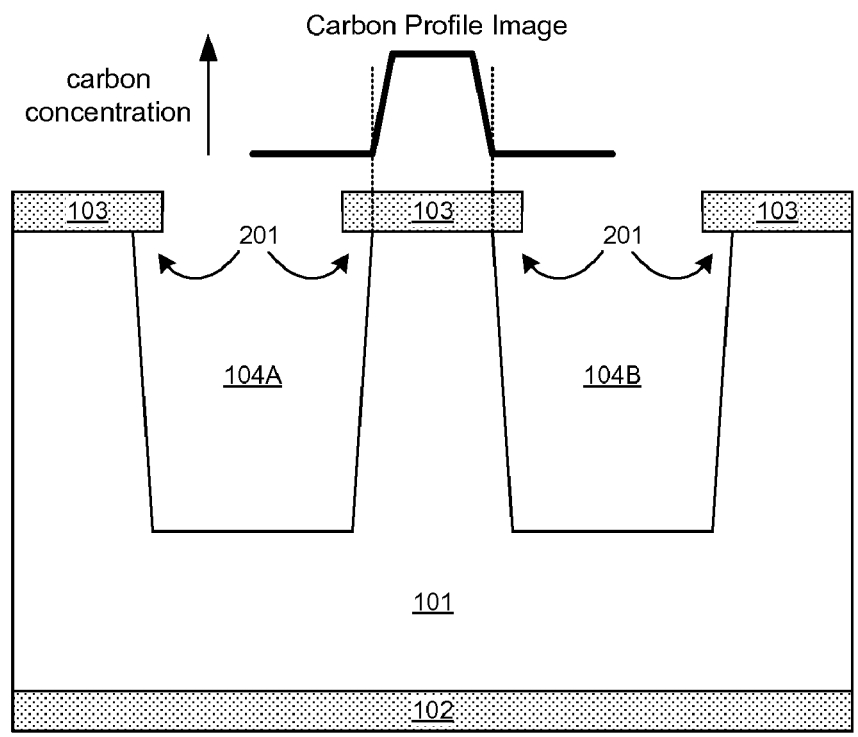

However, unlike in FIG. 2, in this example there is little or no undercut in ILD 100 at the point where ILD 100 and upper hardmask layer 103 meet. This is because carbon enrichment of the sidewalls of trenches 401A, 401B has been performed, resulting in carbon-enriched portions 402. As shown in FIG. 4, portions of upper hardmask 103 may also be carbon enriched. By enriching the trench sidewalls with extra carbon, this helps to reduce or even prevent the above-discussed damage to the trench sidewalls that typically occurs during trench etching. Thus, the undercut problem may be reduced or even avoided, even where ILD layer 101 has a very low K such as 2.5 or less.

To achieve carbon enrichment, carbon atoms are made more available than normal during the etching process. For instance, during traditional RIE, CF, C4F8, and/or CO are conventionally used to etch ILD. However, to provide for carbon enrichment of trench sidewalls, carbon-containing chemicals may be added in gaseous, liquid, or plasma form. For example, the following may be added to the etching chemicals: Argon, CF4, and/or CHF3. These added chemicals each may be added at a flow rate of, for example, about 1000 sccm or less. In some illustrative embodiments, CF4 may be provided at a flow rate of at least 50 sccm, and/or CHF3 may be provided at a flow rate of at least 5 sccm. Moreover, this carbon-enriching RIE step may be performed in an oxygen-deprived environment, preferably with substantially no oxygen at all begin available to the semiconductor device being etched. Thus, for example, CO would not be included.

Thus, during the etching process, while the trenches 401A, 401B are being etched away, carbon is simultaneously being absorbed by the newly exposed surface of ILD layer 101, replacing the carbon that would otherwise be lost or modified during a traditional etching step. Thus, the ILD sidewalls of trenches 401A, 401B contain extra carbon atoms as compared with the surrounding ILD material. These extra carbon atoms may be freely embedded as separate molecules or may become part of the existing ILD molecules. The result may be that any given portion of ILD layer 101 near the trenches 401A, 401B is either etched or remains intact, but otherwise is not weakened much, if at all, by the etching process.

Figure 5:
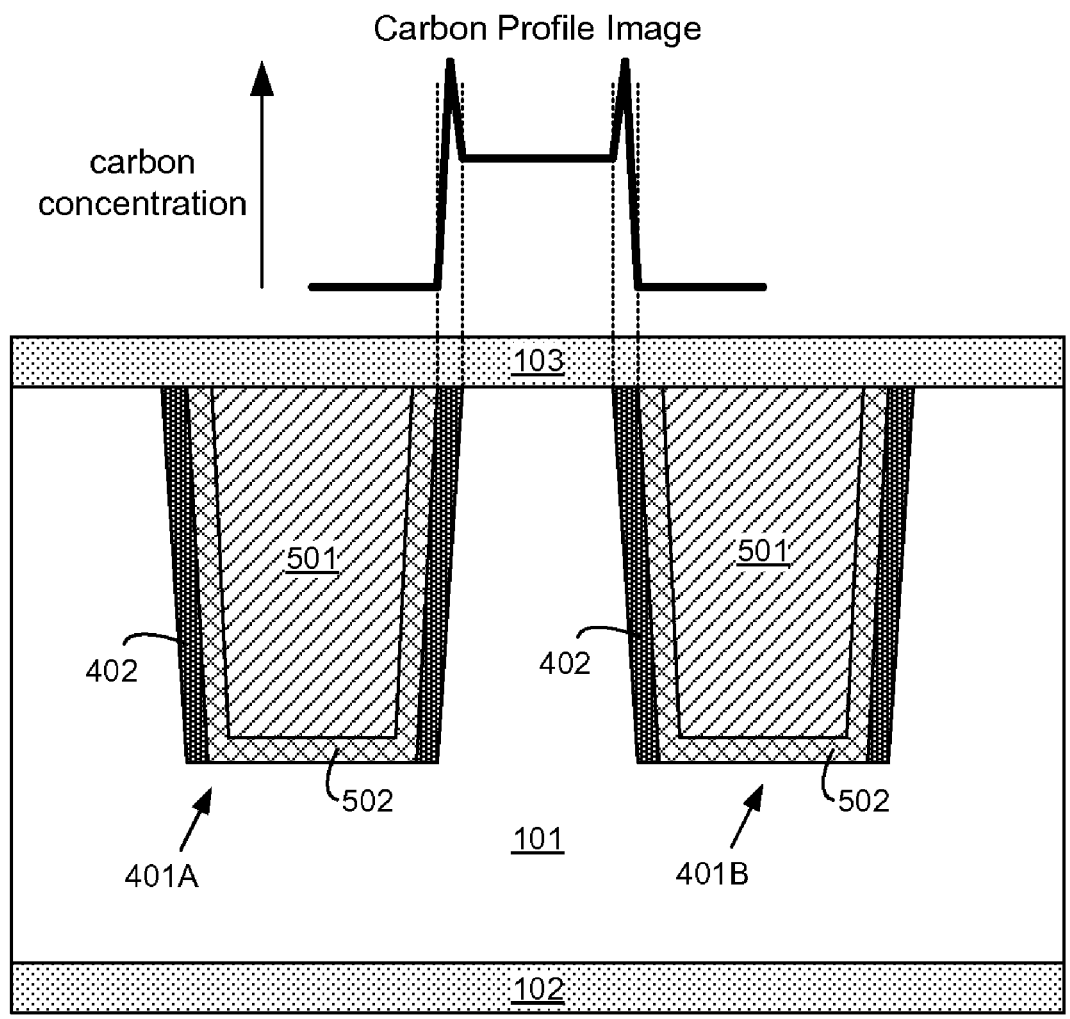

FIG. 5 shows an illustrative carbon profile image resulting from the process in connection with FIGS. 3 and 4. As can be seen, the carbon concentration is greater at the sidewalls of trenches 401A, 401B than in the surrounding ILD material. In particular, the trench sidewalls have a carbon concentration that is higher than the portion of ILD 101 that is disposed between trenches 401A, 401B. In contrast, referring to FIG. 2, the carbon concentration of the sidewalls of trenches 104A, 104B is lower than that of the portion of ILD layer 101 disposed between trenches 104A, 104B. The carbon profile image may be determined by, for example, slicing a cross section of the semiconductor device at one or more trenches and measuring carbon concentration along the cross section using electronic energy loss spectroscopy (EELS).

FIG. 5 also indicates that, within each trench 401A, 401B, a metal barrier layer 402 may be formed that lines the sidewalls and/or bottom of the respective trench. Trenches 401A, 401B may also be filled with or otherwise contain a conductive material such as a metal 501 (e.g., copper). Barrier layer 402 helps reduce migration of metal 501 out of the trench and into ILD layer 101.

Thus, a way of reducing or even preventing hardmask undercut in an ILD trench of a semiconductor device has been described, by forming a carbon-rich layer in the sidewalls of the trench during trench etching.

What is claimed is:

1. A semiconductor device, comprising:
   a silicon layer;
   a dielectric layer disposed on the silicon layer and having a first trench and a second trench disposed such that a region of the dielectric layer exists between the first and second trenches, wherein the first and second trench each contains a metal and has a sidewall having a carbon concentration higher than a carbon concentration of the region of the dielectric layer; and
   a hard mask layer disposed on the dielectric layer, wherein at least a first portion of the hard mask layer has a carbon concentration higher than a carbon concentration than a second portion of the hard mask layer.

2. The semiconductor device of claim 1, further including a first silicon carbon nitride layer disposed on the region of the dielectric layer.

3. The semiconductor device of claim 2, further including a second silicon carbon nitride layer disposed between the silicon layer and the dielectric layer.

4. The semiconductor device of claim 1, wherein the dielectric layer has a K that is less than or equal to 2.5.

5. The semiconductor device of claim 1, wherein the dielectric layer is hydrogenated silicon oxycarbide (SiCOH).

6. The semiconductor device of claim 1, wherein the dielectric layer is SiLK semiconductor dielectric resin.

7. The semiconductor device of claim 1, wherein the metal is copper.

8. The semiconductor device of claim 1, wherein the trench is filled with the metal.

9. The semiconductor device of claim 1, wherein the at least the first portion of the hard mask layer comprises portions of the hard mask layer that are disposed over the sidewalls of the first and second trenches, and wherein the second portion of the hard mask layer is a portion that is not disposed over any of the sidewalls of the first and second trenches.

10. The semiconductor device of claim 1, wherein the sidewalls having the higher carbon concentration are each comprised of a portion of the dielectric layer.

11. The semiconductor device of claim 10, wherein the dielectric layer and the sidewalls are comprised of hydrogenated silicon oxycarbide (SiCOH).

12. A semiconductor device, comprising:
a silicon layer; and
a dielectric layer disposed on the silicon layer and having a first trench and a second trench disposed such that a region of the dielectric layer exists between the first and second trenches, wherein the first and second trench each contains a metal and has a sidewall made of the dielectric layer having a carbon concentration higher than a carbon concentration of the region of the dielectric layer, wherein the dielectric layer and the sidewalls are comprised of hydrogenated silicon oxycarbide (Si-COH).

* * * * *